US011551753B2

(12) United States Patent
    Liu

(10) Patent No.: US 11,551,753 B2
(45) Date of Patent: *Jan. 10, 2023

(54) THREE-DIMENSIONAL MEMORY DEVICE WITH EMBEDDED DYNAMIC RANDOM-ACCESS MEMORY

(71) Applicant: YANGTZE MEMORY TECHNOLOGIES CO., LTD., Wuhan (CN)

(72) Inventor: Jun Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/207,258

(22) Filed: Mar. 19, 2021

(65) Prior Publication Data

US 2021/0210142 A1    Jul. 8, 2021

Related U.S. Application Data

(63) Continuation of application No. 16/453,980, filed on Jun. 26, 2019, now Pat. No. 10,984,862, which is a
(Continued)

(51) Int. Cl.
*G11C 14/00*     (2006.01)
*G11C 16/04*     (2006.01)
(Continued)

(52) U.S. Cl.
CPC ...... *G11C 14/0018* (2013.01); *G11C 16/0483* (2013.01); *H01L 21/50* (2013.01);
(Continued)

(58) Field of Classification Search
None
See application file for complete search history.

(56) References Cited

U.S. PATENT DOCUMENTS

| 5,796,135 A | 8/1998 | Liang et al. |
| 10,784,225 B2 | 9/2020 | Huo et al. |

(Continued)

FOREIGN PATENT DOCUMENTS

| CN | 103378101 A | 10/2013 |
| CN | 103383861 A | 11/2013 |

(Continued)

OTHER PUBLICATIONS

International Search Report issued in corresponding International Application No. PCT/CN2019/085237, dated Feb. 1, 2020, 5 pages.
(Continued)

*Primary Examiner* — Tan T. Nguyen
(74) *Attorney, Agent, or Firm* — Bayes PLLC

(57) ABSTRACT

Embodiments of three-dimensional (3D) memory devices with embedded dynamic random-access memory (DRAM) and methods for forming the 3D memory devices are disclosed. In an example, a method for operating a 3D memory device is disclosed. The 3D memory device includes an input/output circuit, an array of embedded DRAM cells, and an array of 3D NAND memory strings in a same chip. Data is transferred through the input/output circuit to the array of embedded DRAM cells. The data is buffered in the array of embedded DRAM cells. The data is stored in the array of 3D NAND memory strings from the array of embedded DRAM cells.

20 Claims, 13 Drawing Sheets

Related U.S. Application Data continuation of application No. PCT/CN2019/085237, filed on Apr. 30, 2019.

(51) Int. Cl.

| | |
|---|---|
| *H01L 23/00* | (2006.01) |
| *H01L 25/18* | (2006.01) |
| *H01L 25/00* | (2006.01) |
| *H01L 27/108* | (2006.01) |
| *H01L 27/11526* | (2017.01) |
| *H01L 27/11556* | (2017.01) |
| *H01L 27/11573* | (2017.01) |
| *H01L 27/11582* | (2017.01) |
| *H01L 29/04* | (2006.01) |
| *H01L 29/16* | (2006.01) |
| *H01L 21/50* | (2006.01) |
| *H01L 27/06* | (2006.01) |
| *H01L 27/1157* | (2017.01) |
| *H01L 27/11578* | (2017.01) |

(52) U.S. Cl.
CPC .............. *H01L 24/03* (2013.01); *H01L 24/05* (2013.01); *H01L 24/06* (2013.01); *H01L 24/08* (2013.01); *H01L 24/27* (2013.01); *H01L 24/32* (2013.01); *H01L 24/73* (2013.01); *H01L 24/83* (2013.01); *H01L 25/18* (2013.01); *H01L 25/50* (2013.01); *H01L 27/0688* (2013.01); *H01L 27/10808* (2013.01); *H01L 27/10847* (2013.01); *H01L 27/10852* (2013.01); *H01L 27/10873* (2013.01); *H01L 27/10897* (2013.01); *H01L 27/1157* (2013.01); *H01L 27/11526* (2013.01); *H01L 27/11556* (2013.01); *H01L 27/11573* (2013.01); *H01L 27/11578* (2013.01); *H01L 27/11582* (2013.01); *H01L 29/04* (2013.01); *H01L 29/16* (2013.01); *H01L 2224/04042* (2013.01); *H01L 2224/05569* (2013.01); *H01L 2224/08145* (2013.01); *H01L 2224/32145* (2013.01); *H01L 2224/73215* (2013.01); *H01L 2224/80895* (2013.01); *H01L 2224/80896* (2013.01); *H01L 2224/83895* (2013.01); *H01L 2224/83896* (2013.01)

(56) References Cited

U.S. PATENT DOCUMENTS

| | | | |
|---|---|---|---|
| 10,957,705 | B2 * | 3/2021 | Totoki ............... H01L 27/11582 |
| 10,984,862 | B2 * | 4/2021 | Liu .......................... H01L 25/18 |
| 2005/0128808 | A1 | 6/2005 | Sakui |
| 2009/0129186 | A1 | 5/2009 | Schnell et al. |
| 2015/0055413 | A1 | 2/2015 | Alsmeier |
| 2015/0255158 | A1 | 9/2015 | Fujita et al. |
| 2015/0340366 | A1 | 11/2015 | Lim et al. |
| 2016/0071591 | A1 | 3/2016 | Hsu |
| 2018/0204820 | A1 | 7/2018 | Zhai et al. |
| 2018/0340894 | A1 | 11/2018 | Rim et al. |
| 2018/0374864 | A1 | 12/2018 | Fukuzumi et al. |
| 2019/0123022 | A1 | 4/2019 | Teig et al. |
| 2020/0058696 | A1 | 2/2020 | Shen et al. |
| 2020/0258857 | A1 | 8/2020 | Huo et al. |
| 2021/0217716 | A1 * | 7/2021 | Wu .......................... H01L 24/04 |

FOREIGN PATENT DOCUMENTS

| | | |
|---|---|---|
| CN | 104576646 A | 4/2015 |
| CN | 105097019 A | 11/2015 |
| CN | 107658315 A | 2/2018 |
| CN | 109148498 A | 1/2019 |
| CN | 109155301 A | 1/2019 |
| CN | 109411473 A | 3/2019 |
| CN | 109545764 A | 3/2019 |
| CN | 109564923 A | 4/2019 |
| DE | 102015105858 A1 | 11/2015 |
| TW | 201824513 A | 7/2018 |
| TW | 201913966 A | 4/2019 |
| WO | 2018071143 A2 | 4/2018 |
| WO | 2020210928 A1 | 10/2020 |

OTHER PUBLICATIONS

Extended European Search Report issued in corresponding European Application No. 19927324.4, dated Jun. 28, 2022, 10 pages.

* cited by examiner

100

101

200

THREE-DIMENSIONAL MEMORY DEVICE WITH EMBEDDED DYNAMIC RANDOM-ACCESS MEMORY

CROSS-REFERENCE TO RELATED APPLICATIONS

This application is a continuation of U.S. application Ser. No. 16/453,980, filed on Jun. 26, 2019, entitled "THREE-DIMENSIONAL MEMORY DEVICE WITH EMBEDDED DYNAMIC RANDOM-ACCESS MEMORY," which is a continuation of International Application No. PCT/CN2019/085237, filed on Apr. 30, 2019, entitled "THREE-DIMENSIONAL MEMORY DEVICE WITH EMBEDDED DYNAMIC RANDOM-ACCESS MEMORY," both of which are incorporated herein by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices with an embedded dynamic random-access memory (DRAM) and fabrication methods thereof are disclosed herein.

In one example, a 3D memory device includes a first semiconductor structure including a peripheral circuit, an array of embedded DRAM cells, and a first bonding layer including a plurality of first bonding contacts. The 3D memory device also further includes a second semiconductor structure including an array of 3D NAND memory strings and a second bonding layer including a plurality of second bonding contacts. The 3D memory device further includes a bonding interface between the first bonding layer and the second bonding layer. The first bonding contacts are in contact with the second bonding contacts at the bonding interface.

In another example, a method for forming a 3D memory device is disclosed. A first semiconductor structure is formed. The first semiconductor structure includes a peripheral circuit, an array of embedded DRAM cells, and a first bonding layer including a plurality of first bonding contacts. A second semiconductor structure is formed. The second semiconductor structure includes an array of 3D NAND memory strings and a second bonding layer including a plurality of second bonding contacts. The first semiconductor structure and the second semiconductor structure are bonded in a face-to-face manner, such that the first bonding contacts are in contact with the second bonding contacts at a bonding interface.

In still another example, a method for operating a 3D memory device is disclosed. The 3D memory device includes an input/output circuit, an array of embedded DRAM cells, and an array of 3D NAND memory strings in a same chip. Data is transferred through the input/output circuit to the array of embedded DRAM cells. The data is buffered in the array of embedded DRAM cells. The data is stored in the array of 3D NAND memory strings from the array of embedded DRAM cells.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
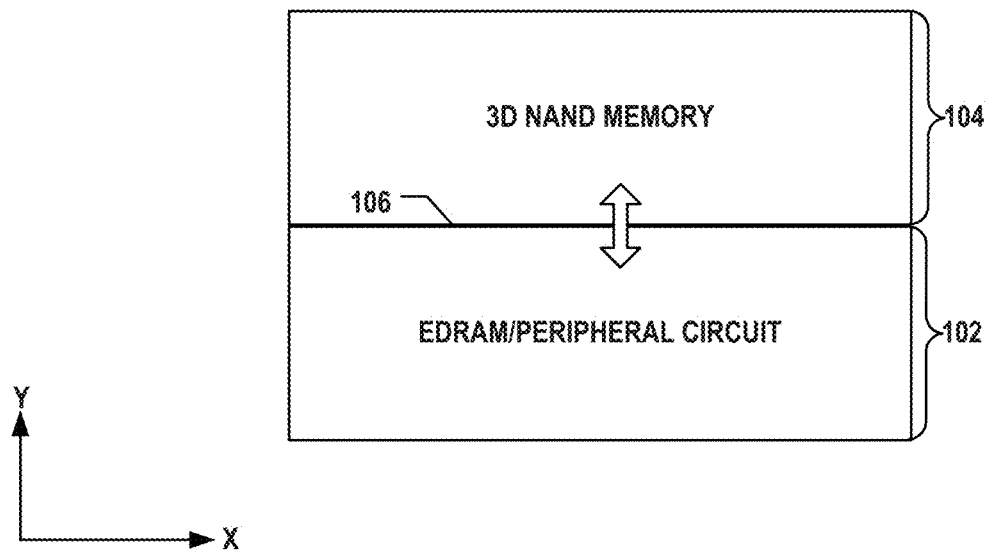
FIG. 1A illustrates a schematic view of a cross-section of an exemplary 3D memory device with an embedded DRAM, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In conventional 3D memory devices, the periphery circuits that are formed outside of memory array devices on the same plane can occupy a large area of the device chip, thereby leading to poor array efficiency, large die size, and high cost. Also, the thermal budget associated with processing the memory array device limits the peripheral circuit performance requirement, making it difficult to achieve high input/output (I/O) speed of the 3D memory device. Moreover, for 3D NAND memory devices, the NAND memory cell program, erase, and read speeds are intrinsically slow compared with other types of memory devices, such as DRAM and static RAM (SRAM).

Various embodiments in accordance with the present disclosure provide a 3D memory device having an on-chip embedded DRAM with improved I/O speed, throughput, and memory density. In some embodiments, the peripheral circuits (e.g., control and sensing circuits) of 3D NAND memory are formed on a separate substrate using high-speed advanced logic device processing. Embedded DRAM cells can be formed on the same substrate as the peripheral circuits to take advantages of empty wafer space and serve as high-speed memory buffer of the 3D NAND memory. 3D NAND memory can be formed on another substrate and bonded to the substrate on which the peripheral circuits and embedded DRAM cells are formed. As a result, memory array efficiency is increased and die size and bit cost are reduced, thereby greatly boosting the memory device performance. The I/O speed and throughput of the 3D memory devices can match the speed and throughput of DRAM and peripheral logic devices. By integrating high-speed volatile memory (e.g., DRAM) and high density/capacity non-volatile memory (e.g., 3D NAND memory) in one chip, high-speed non-volatile data storage can be achieved. For example, the 3D memory devices with the embedded DRAM disclosed herein can enable an instant-on feature on mobile devices or computers because of its high-speed non-volatile data storage capability.

FIG. 1A illustrates a schematic view of a cross-section of an exemplary 3D memory device 100 with an embedded DRAM, according to some embodiments. 3D memory device 100 represents an example of a non-monolithic 3D memory device. The term "non-monolithic" means that the components of 3D memory device 100 (e.g., peripheral circuit/embedded DRAM and 3D NAND memory) can be formed separately on different substrates and then joined to form a 3D memory device. 3D memory device 100 can include a first semiconductor structure 102 including peripheral circuits and an array of embedded DRAM cells. Both peripheral circuits and the embedded DRAM cell array can be implemented with advanced logic processes (e.g., technology nodes of 90 nm, 80 nm, 65 nm, 55 nm, 45 nm, 40 nm, 32 nm, 28 nm, 22 nm, 20 nm, 16 nm, 14 nm, 10 nm, 7 nm, 5 nm, 3 nm, etc.) to achieve high speed. In some embodiments, the peripheral circuits and embedded DRAM cell array in first semiconductor structure are using complementary metal-oxide-semiconductor (CMOS) technology.

In some embodiments, the peripheral circuits include any suitable digital, analog, and/or mixed-signal peripheral circuits used for facilitating the operation of 3D memory device 100. For example, the peripheral circuits can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). An embedded DRAM is a DRAM integrated on the same die of logic circuits (e.g., the peripheral circuits), which allows wider bus and higher operation speed. Embedded DRAM, like all types of DRAM, require periodic refreshing of the memory cells. The memory controller for refreshing the embedded DRAM can be embedded as part of the peripheral circuits. In some embodiments, each embedded DRAM cell includes a capacitor for string a bit of data as a positive of negative electrical charge as well as one or more transistors that control access to it. In one example, each embedded DRAM cell is a one-transistor, one-capacitor (1T1C) cell.

3D memory device 100 can also include a second semiconductor structure 104 including an array of 3D NAND memory strings. That is, second semiconductor structure 104 can be a NAND Flash memory device in which memory cells are provided in the form of an array of NAND memory strings. In some embodiments, depending on the NAND technology (e.g., the number of levels/tiers in the memory stack), a 3D NAND memory string typically consists of 32 to 256 NAND memory cells. 3D NAND memory strings can be organized into pages which are then organized into blocks in which each 3D NAND memory string is connected to a separate line called a bit line (BL). All cells with the same position in the 3D NAND memory string can be connected through the control gates by a word line (WL). In some embodiments, a plane contains a certain number of blocks that are connected through the same bit line. Second semiconductor structure 104 can include one or more planes, and the peripheral circuits that are needed to perform all the read/write/erase operations can be included in first semiconductor structure 102.

As shown in FIG. 1A, 3D memory device 100 further includes a bonding interface 106 vertically between first semiconductor structure 102 and second semiconductor structure 104. As described below in detail, first and second semiconductor structures 102 and 104 can be fabricated separately (and in parallel in some embodiments) such that the thermal budget of fabricating one of first and second semiconductor structures 102 and 104 does not limit the processes of fabricating another one of first and second semiconductor structures 102 and 104. Moreover, a large number of interconnects (e.g., bonding contacts via hybrid bonding) can be formed through bonding interface 106 to make direct, short electrical connections between first semiconductor structure 102 and second semiconductor structure 104, as opposed to the long-distance chip-to-chip data bus on the circuit board, thereby eliminating chip interface delay and achieving high-speed I/O throughput with reduced power consumption. Data transfer between the array of 3D NAND memory strings in second semiconductor structure 104 and the array of embedded DRAM cells in first semiconductor structure 102 can be performed through the interconnects (e.g., bonding contacts via hybrid bonding) across bonding interface 106. Furthermore, by vertically integrating first and second semiconductor structures 102 and 104, the chip size can be reduced, and the memory cell density can be increased.

Figure 1B:
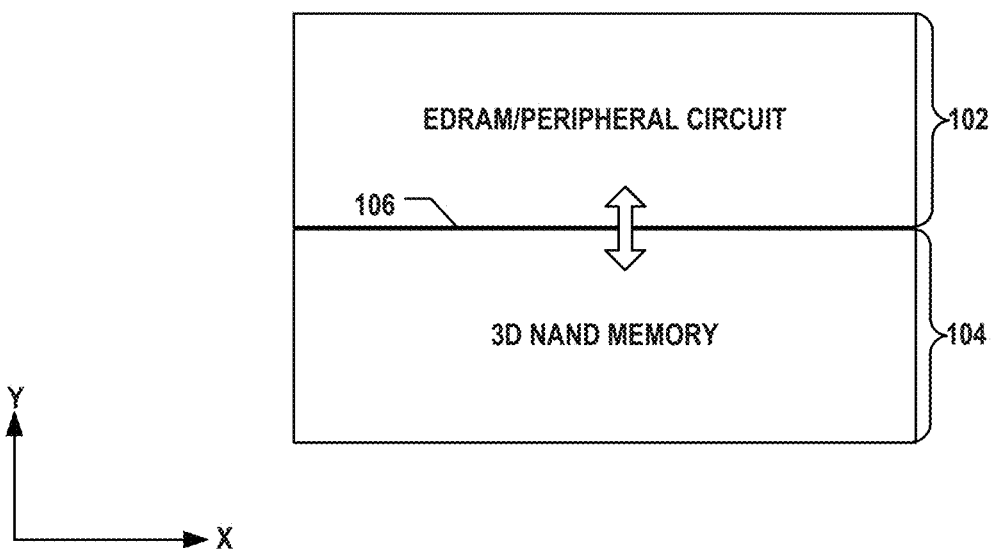
FIG. 1B illustrates a schematic view of a cross-section of another exemplary 3D memory device with an embedded DRAM, according to some embodiments.

It is understood that the relative positions of stacked first and second semiconductor structures 102 and 104 are not limited. FIG. 1B illustrates a schematic view of a cross-section of another exemplary 3D memory device 101 with an embedded DRAM, according to some embodiments. Different from 3D memory device 100 in FIG. 1A in which second semiconductor structure 104 including the array of 3D NAND memory strings is above first semiconductor structure 102 including the peripheral circuits and the array of embedded DRAM cells, in 3D memory device 100 in FIG. 1B, first semiconductor structure 102 including the peripheral circuits and the array of embedded DRAM cells is above second semiconductor structure 104 including the array of 3D NAND memory strings. Nevertheless, bonding interface 106 is formed vertically between first and second semiconductor structures 102 and 104 in 3D memory device 101 as well as first and second semiconductor structures 102 and 104 are joined vertically through bonding (e.g., hybrid bonding) according to some embodiments. Data transfer between the array of 3D NAND memory strings in second semiconductor structure 104 and the array of embedded DRAM cells in first semiconductor structure 102 can be performed through the interconnects (e.g., bonding contacts via hybrid bonding) across bonding interface 106.

Figure 2:
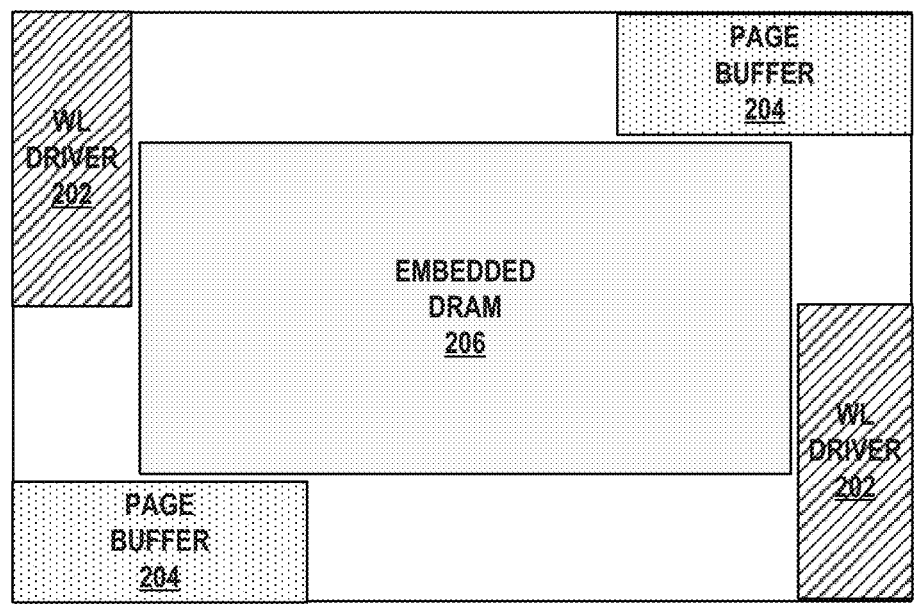
FIG. 2 illustrates a schematic plan view of an exemplary semiconductor structure having a peripheral circuit and an embedded DRAM, according to some embodiments.

FIG. 2 illustrates a schematic plan view of an exemplary semiconductor structure 200 having a peripheral circuit and an embedded DRAM, according to some embodiments. Semiconductor structure 200 may be one example of first semiconductor structure 102. Semiconductor structure 200 can include peripheral circuits for controlling and sensing a 3D NAND memory, including word line drivers 202, page buffers 204, and any other suitable circuits. Semiconductor structure 200 can further include embedded DRAM 206 on the same die as the peripheral circuits and fabricated using the same logic process as the peripheral circuits. FIG. 2 shows an exemplary layout of the peripheral circuits (e.g., word line drivers 202, page buffers 204) and embedded DRAM 206 in which peripheral circuits (e.g., word line drivers 202, page buffers 204) and embedded DRAM 206 are formed in different regions on the same plane. For example, embedded DRAM 206 may be formed outside of the peripheral circuits (e.g., word line drivers 202, page buffers 204). It is understood that the layout of semiconductor structure 200 is not limited to the exemplary layout in FIG. 2. In some embodiments, the peripheral circuit (e.g., word line drivers 202, page buffers 204) and embedded DRAM 206 (e.g., the array of embedded DRAM cells) are stacked one over another, i.e., on different planes. For example, embedded DRAM 206 (e.g., the array of embedded DRAM cells) may be formed above or below the peripheral circuit (e.g., word line drivers 202, page buffers 204) to further reduce the chip size.

Figure 3:
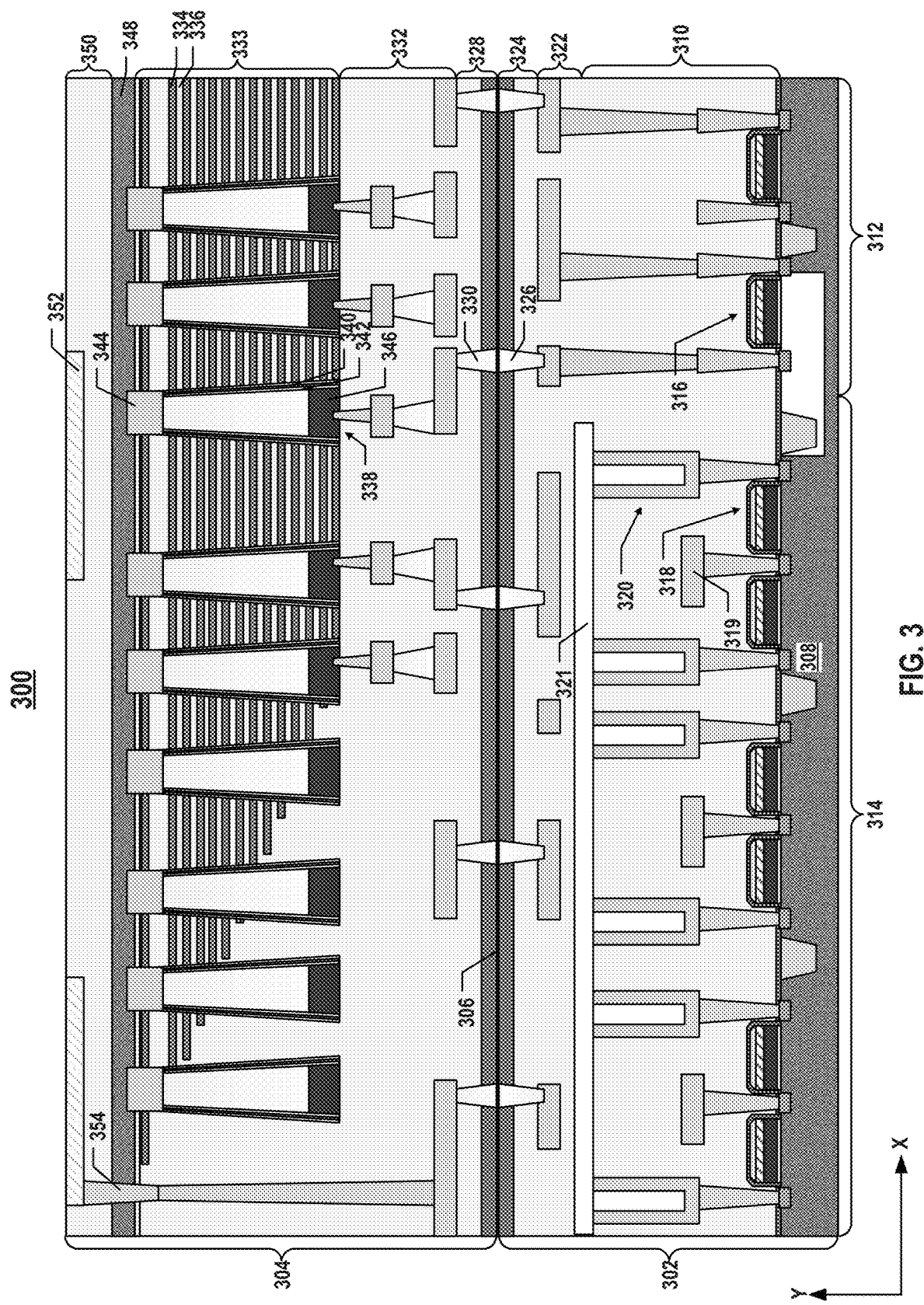
FIG. 3 illustrates a cross-section of an exemplary 3D memory device with an embedded DRAM, according to some embodiments.

FIG. 3 illustrates a cross-section of an exemplary 3D memory device 300 with an embedded DRAM, according to some embodiments. As one example of 3D memory device 100 described above with respect to FIG. 1A, 3D memory device 300 is a non-monolithic 3D memory device including a first semiconductor structure 302 and a second semiconductor structure 304 stacked over first semiconductor structure 302. First and second semiconductor structures 302 and 304 are joined at a bonding interface 306 therebetween. As shown in FIG. 3, first semiconductor structure 302 can include a substrate 308, which can include silicon (e.g., single crystalline silicon), silicon germanium (SiGe), gallium arsenide (GaAs), germanium (Ge), silicon on insulator (SOI), or any other suitable materials.

First semiconductor structure 302 of 3D memory device 300 can include a device layer 310 above substrate 308. It is noted that x and y axes are added in FIG. 3 to further illustrate the spatial relationship of the components in 3D memory device 300. Substrate 308 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 300) is determined relative to the substrate of the semiconductor device (e.g., substrate 308) in the y-direction (the vertical direction or thickness direction) when the substrate is positioned in the lowest plane of the semiconductor device in the y-direction. The same notion for describing spatial relationship is applied throughout the present disclosure.

In some embodiments, device layer 310 includes a peripheral circuit 312 on substrate 308 and an array of embedded DRAM cells 314 on substrate 308 and outside of peripheral circuit 312. In some embodiments, peripheral circuit 312 includes a plurality of peripheral transistors 316 forming any suitable digital, analog, and/or mixed-signal peripheral circuits used for facilitating the operation of 3D memory device 300 including, but not limited to, a page buffer, a decoder (e.g., a row decoder and a column decoder), a sense amplifier, a driver, a charge pump, a current or voltage reference. Peripheral transistors 316 can be formed "on" substrate 308, in which the entirety or part of peripheral transistors 316 are formed in substrate 308 (e.g., below the top surface of substrate 308) and/or directly on substrate 308. Isolation regions (e.g., shallow trench isolations (STIs)) and doped regions (e.g., source regions and drain regions of peripheral transistors 316) can be formed in substrate 308 as well.

In some embodiments, each embedded DRAM cell 314 includes a DRAM selection transistor 318 and a capacitor 320. Embedded DRAM cell 314 can be a 1T1C cell consisting of one transistor and one capacitor. It is understood that embedded DRAM cell 314 may be of any suitable configuration, such as 2T1C cell, 3T1C cell, etc. In some embodiments, DRAM selection transistors 318 are formed "on" substrate 308, in which the entirety or part of DRAM selection transistors 318 are formed in substrate 308 (e.g., below the top surface of substrate 308) and/or directly on substrate 308. Isolation regions (e.g., shallow trench isolations (STIs)) and doped regions (e.g., source regions and drain regions of DRAM selection transistors 318) can be formed in substrate 308 as well. As shown in FIG. 3, DRAM selection transistors 318 and peripheral transistors 316 can be formed in different regions on the same plane, e.g., on substrate 308. That is, DRAM selection transistors 318 can be formed outside of the region in which peripheral circuit 312 is formed on substrate 308. In some embodiments, capacitors 320 are formed above DRAM selection transistors 318. Each capacitor 320 includes two electrodes, one of which is electrically connected to one node of respective DRAM selection transistor 318, according to some embodiments. Another node of each DRAM selection transistor 318 is electrical connected to a bit line 319 of embedded DRAM, according to some embodiments. Another electrode of each capacitor 320 can be electrically connected to a common plate 321, e.g., a common ground. It is understood that the structure and configuration of embedded DRAM cell 314 are not limited to the example in FIG. 3 and may include any suitable structure and configuration. For example, capacitor 320 may be a planar capacitor, a stack capacitor, a multi-fins capacitor, a cylinder capacitor, a trench capacitor, or a substrate-plate capacitor.

In some embodiments, first semiconductor structure 302 of 3D memory device 300 further includes an interconnect layer 322 above device layer 310 to transfer electrical signals to and from peripheral circuit 312 and array of embedded DRAM cells 314. Interconnect layer 322 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Interconnect layer 322 can further include one or more interlayer dielectric (ILD) layers (also known as "intermetal dielectric (IMD) layers") in which the interconnect lines and via contacts can form. That is, interconnect layer 322 can include interconnect lines and via contacts in multiple ILD layers. The interconnect lines and via contacts in interconnect layer 322 can include conductive materials including, but not limited to, tungsten (W), cobalt (Co), copper (Cu), aluminum (Al), silicides, or any combination thereof. The ILD layers in interconnect layer 322 can include dielectric materials including, but not limited to, silicon oxide, silicon nitride, silicon oxynitride, low dielectric constant (low-k) dielectrics, or any combination thereof.

As shown in FIG. 3, first semiconductor structure 302 of 3D memory device 300 can further include a bonding layer 324 at bonding interface 306 and above interconnect layer 322 and device layer 310 (including peripheral circuit 312 and array of embedded DRAM cells 314). Bonding layer 324 can include a plurality of bonding contacts 326 and dielectrics electrically isolating bonding contacts 326. Bonding contacts 326 can include conductive materials including, but not limited to, W, Co, Cu, Al, silicides, or any combination thereof. The remaining area of bonding layer 324 can be formed with dielectrics including, but not limited to, silicon oxide, silicon nitride, silicon oxynitride, low-k dielectrics, or any combination thereof. Bonding contacts 326 and surrounding dielectrics in bonding layer 324 can be used for hybrid bonding.

Similarly, as shown in FIG. 3, second semiconductor structure 304 of 3D memory device 300 can also include a bonding layer 328 at bonding interface 306 and above bonding layer 324 of first semiconductor structure 302. Bonding layer 328 can include a plurality of bonding contacts 330 and dielectrics electrically isolating bonding contacts 330. Bonding contacts 330 can include conductive materials including, but not limited to, W, Co, Cu, Al, silicides, or any combination thereof. The remaining area of bonding layer 328 can be formed with dielectrics including, but not limited to, silicon oxide, silicon nitride, silicon oxynitride, low-k dielectrics, or any combination thereof. Bonding contacts 330 and surrounding dielectrics in bonding layer 328 can be used for hybrid bonding.

As described above, second semiconductor structure 304 can be bonded on top of first semiconductor structure 302 in a face-to-face manner at bonding interface 306. In some embodiments, bonding interface 306 is disposed between bonding layers 324 and 328 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 306 is the place at which bonding layers 324 and 328 are met and bonded. In practice, bonding interface 306 can be a layer with a certain thickness that includes the top surface of bonding layer 324 of first semiconductor structure 302 and the bottom surface of bonding layer 328 of second semiconductor structure 304.

In some embodiments, second semiconductor structure 304 of 3D memory device 300 further includes an interconnect layer 332 above bonding layer 328 to transfer electrical signals. Interconnect layer 332 can include a plurality of interconnects, such as MEOL interconnects and BEOL interconnects. Interconnect layer 332 can further include one or more ILD layers in which the interconnect lines and via contacts can form. The interconnect lines and via contacts in interconnect layer 332 can include conductive materials including, but not limited to, W, Co, Cu, Al, silicides, or any combination thereof. The ILD layers in interconnect layer 332 can include dielectric materials including, but not limited to, silicon oxide, silicon nitride, silicon oxynitride, low-k dielectrics, or any combination thereof.

In some embodiments, second semiconductor structure 304 of 3D memory device 300 includes a NAND Flash memory device in which memory cells are provided in the form of an array of 3D NAND memory strings 338 above interconnect layer 332 and bonding layer 328. Each 3D NAND memory string 338 extends vertically through a plurality of pairs each including a conductor layer 334 and a dielectric layer 336, according to some embodiments. The stacked and interleaved conductor layers 334 and dielectric layer 336 are also referred to herein as a memory stack 333. Interleaved conductor layers 334 and dielectric layers 336 in memory stack 333 alternate in the vertical direction, according to some embodiments. In other words, except the ones at the top or bottom of memory stack 333, each conductor layer 334 can be adjoined by two dielectric layers 336 on both sides, and each dielectric layer 336 can be adjoined by two conductor layers 334 on both sides. Conductor layers 334 can each have the same thickness or different thicknesses. Similarly, dielectric layers 336 can each have the same thickness or different thicknesses. Conductor layers 334 can include conductor materials including, but not limited to, W, Co, Cu, Al, doped silicon, silicides, or any combination thereof. Dielectric layers 336 can include dielectric materials including, but not limited to, silicon oxide, silicon nitride, silicon oxynitride, or any combination thereof.

In some embodiments, each 3D NAND memory string 338 is a "charge trap" type of NAND memory string including a semiconductor channel 342 and a memory film 340. In some embodiments, semiconductor channel 342 includes silicon, such as amorphous silicon, polysilicon, or single crystalline silicon. In some embodiments, memory film 340 is a composite dielectric layer including a tunneling layer, a storage layer (also known as "charge trap/storage layer"), and a blocking layer. Each 3D NAND memory string 338 can have a cylinder shape (e.g., a pillar shape). Semiconductor channel 342, the tunneling layer, the storage layer, and the blocking layer of memory film 340 are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as an aluminum oxide ($Al_2O_3$), or hafnium oxide ($HfO_2$) or tantalum oxide ($Ta_2O_5$) layer, and so on.

In some embodiments, 3D NAND memory strings 338 further include a plurality of control gates (each being part of a word line). Each conductor layer 334 in memory stack 333 can act as a control gate for each memory cell of 3D NAND memory string 338. In some embodiments, each 3D NAND memory string 338 includes two plugs 344 and 346 at a respective end in the vertical direction. Plug 344 can include a semiconductor material, such as single-crystal silicon, that is epitaxially grown from a semiconductor layer 348. Plug 344 can function as the channel controlled by a source select gate of 3D NAND memory string 338. Plug 344 can be at the upper end of 3D NAND memory string 338 and in contact with semiconductor channel 342. As used herein, the "upper end" of a component (e.g., 3D NAND memory string 338) is the end father away from substrate 308 in the y-direction, and the "lower end" of the component (e.g., 3D NAND memory string 338) is the end closer to substrate 308 in the y-direction when substrate 308 is positioned in the lowest plane of 3D memory device 300. Another Plug 346 can include semiconductor materials (e.g., polysilicon) or conductor materials (e.g., metals). In some embodiments, plug 346 includes an opening filled with titanium/titanium nitride (Ti/TiN as a barrier layer) and tungsten (as a conductor). By covering the upper end of 3D NAND memory string 338 during the fabrication of 3D memory device 300, plug 346 can function as an etch stop layer to prevent etching of dielectrics filled in 3D NAND memory string 338, such as silicon oxide and silicon nitride. In some embodiments, plug 346 functions as the drain of 3D NAND memory string 338.

In some embodiments, first semiconductor structure 302 further includes semiconductor layer 348 disposed above memory stack 333 and 3D NAND memory strings 338. Semiconductor layer 348 can be a thinned substrate on which memory stack 333 and 3D NAND memory strings 338 are formed. In some embodiments, semiconductor layer 348 includes single-crystal silicon from which plugs 344 can be epitaxially grown. In some embodiments, semiconductor layer 348 can include polysilicon, amorphous silicon, SiGe, GaAs, Ge, or any other suitable materials. Semiconductor layer 348 can also include isolation regions and doped regions (e.g., functioning as an array common source for 3D NAND memory strings 338, not shown). Isolation regions (not shown) can extend across the entire thickness or part of the thickness of semiconductor layer 348 to electrically isolate the doped regions. In some embodiments, a pad oxide layer including silicon oxide is disposed between memory stack 333 and semiconductor layer 348.

It is understood that 3D NAND memory strings 338 are not limited to the "charge trap" type of 3D NAND memory strings and may be "floating gate" type of 3D NAND memory strings in other embodiments. Semiconductor layer 348 may include polysilicon as the source plate of the "floating gate" type of 3D NAND memory strings.

As shown in FIG. 3, second semiconductor structure 304 of 3D memory device 300 can further include a pad-out interconnect layer 350 above semiconductor layer 348. Pad-out interconnect layer 350 include interconnects, e.g., contact pads 352, in one or more ILD layers. The pad-out interconnect layer 350 and interconnect layer 332 can be formed at opposite sides of semiconductor layer 348. In some embodiments, the interconnects in pad-out interconnect layer 350 can transfer electrical signals between 3D memory device 300 and outside circuits, e.g., for pad-out purposes.

In some embodiments, second semiconductor structure 304 further includes one or more contacts 354 extending through semiconductor layer 348 to electrically connect pad-out interconnect layer 350 and interconnect layers 332 and 322. As a result, array of embedded DRAM cells 314 can be electrically connected to array of 3D NAND memory strings 338 through interconnect layers 322 and 332 as well as bonding contacts 326 and 330. Moreover, peripheral circuit 312, array of embedded DRAM cells 314, and array of 3D NAND memory strings 338 can be electrically connected to outside circuits through contacts 354 and pad-out interconnect layer 350.

Figure 4:
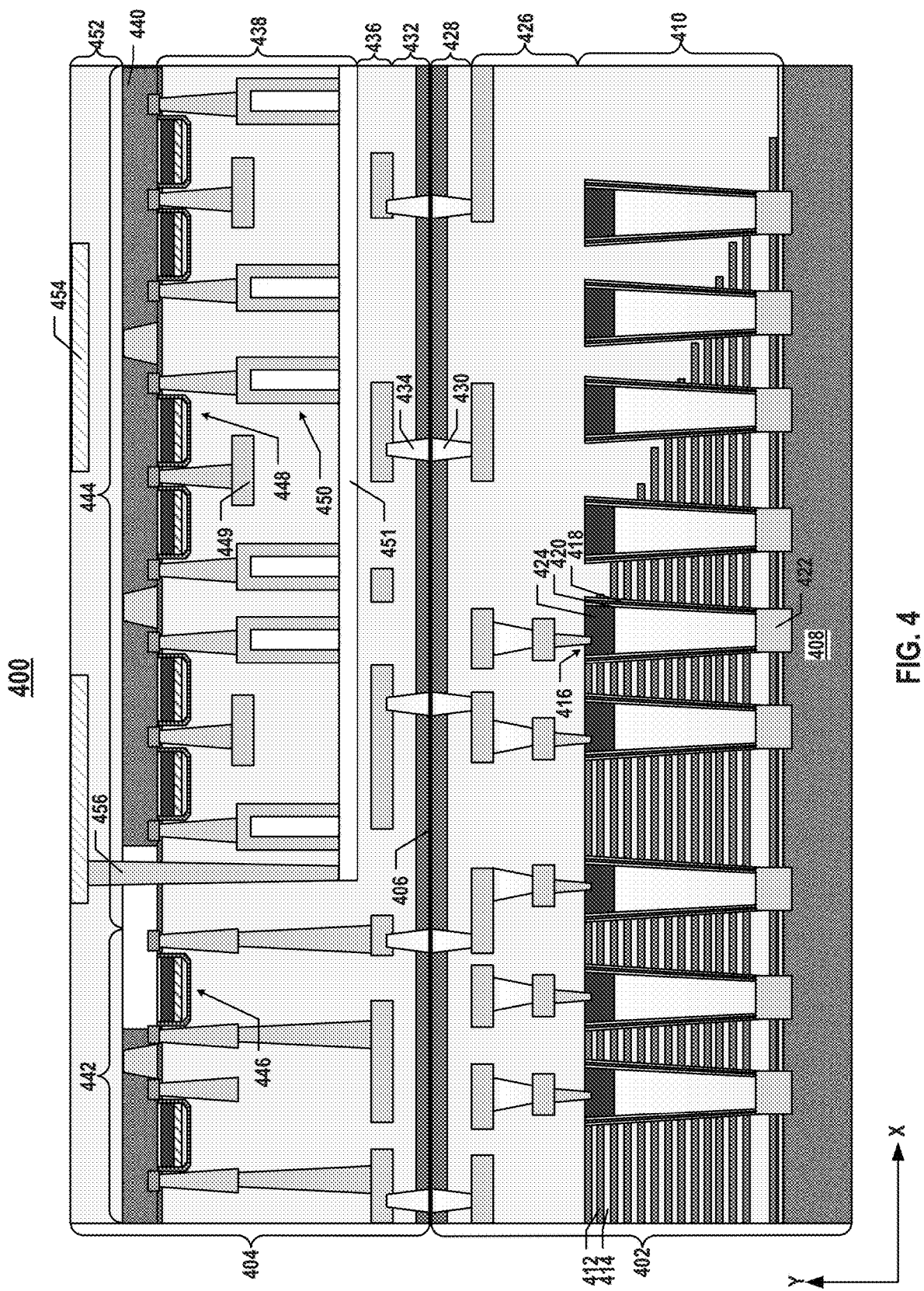
FIG. 4 illustrates a cross-section of another exemplary 3D memory device with an embedded DRAM, according to some embodiments.

FIG. 4 illustrates a cross-section of another exemplary 3D memory device 400 with an embedded DRAM, according to some embodiments. Similar to 3D memory device 300 described above in FIG. 3, 3D memory device 400 represents an example of a non-monolithic 3D memory device in which a first semiconductor structure 402 including 3D NAND memory strings and a second semiconductor structure 404 including peripheral circuits and embedded DRAM cells are formed separately and bonded in a face-to-face manner at a bonding interface 406. Different from 3D memory device 300 described above in FIG. 3 in which first semiconductor structure 302 including peripheral circuits and embedded DRAM cells is below second semiconductor structure 304 including 3D NAND memory strings, 3D memory device 400 in FIG. 4 includes second semiconductor structure 404 including peripheral circuits and embedded DRAM cells disposed above first semiconductor structure 402 including 3D NAND memory strings. It is understood that the details of similar structures (e.g., materials, fabrication process, functions, etc.) in both 3D memory devices 300 and 400 may not be repeated below.

First semiconductor structure 402 of 3D memory device 400 can include a substrate 408 and a memory stack 410 including interleaved conductor layers 412 and dielectric layers 414 above substrate 408. In some embodiments, an array of 3D NAND memory strings 416 each extends vertically through interleaved conductor layers 412 and dielectric layers 414 in memory stack 410 above substrate 408. Each 3D NAND memory string 416 can include a semiconductor channel 420 and a memory film 418. Each 3D NAND memory string 416 further includes two plugs 422 and 424 at its lower end and upper end, respectively. 3D NAND memory strings 416 can be "charge trap" type of 3D NAND memory strings or "floating gate" type of 3D NAND memory strings. In some embodiments, a pad oxide layer including silicon oxide is disposed between memory stack 410 and substrate 408.

In some embodiments, first semiconductor structure 402 of 3D memory device 400 also includes an interconnect layer 426 above memory stack 410 and 3D NAND memory strings 416 to transfer electrical signals to and from 3D NAND memory strings 416. Interconnect layer 426 can include a plurality of interconnects, including interconnect lines and via contacts. In some embodiments, the interconnects in interconnect layer 426 also include local interconnects, such as bit line contacts and word line contacts. In some embodiments, first semiconductor structure 402 of 3D memory device 400 further includes a bonding layer 428 at bonding interface 406 and above interconnect layer 426 and memory stack 410. Bonding layer 428 can include a plurality of bonding contacts 430 and dielectrics surrounding and electrically isolating bonding contacts 430.

As shown in FIG. 4, second semiconductor structure 404 of 3D memory device 400 includes another bonding layer 432 at bonding interface 406 and above bonding layer 428. Bonding layer 432 can include a plurality of bonding contacts 434 and dielectrics surrounding and electrically isolating bonding contacts 434. In some embodiments, second semiconductor structure 404 of 3D memory device 400 also includes an interconnect layer 436 above bonding layer 432 to transfer electrical signals. Interconnect layer 436 can include a plurality of interconnects, including interconnect lines and via contacts.

Second semiconductor structure 404 of 3D memory device 400 can further include a device layer 438 above interconnect layer 436 and bonding layer 432. In some embodiments, device layer 438 includes a peripheral circuit 442 above interconnect layer 436 and bonding layer 432 and an array of embedded DRAM cells 444 above interconnect layer 436 and bonding layer 432 and outside of peripheral circuit 442. In some embodiments, peripheral circuit 442 includes a plurality of peripheral transistors 446 forming any suitable digital, analog, and/or mixed-signal peripheral circuits used for facilitating the operation of 3D memory device 400 including, but not limited to, a page buffer, a decoder (e.g., a row decoder and a column decoder), a sense amplifier, a driver, a charge pump, a current or voltage reference. Peripheral transistors 446 can be formed "on" a semiconductor layer 440, in which the entirety or part of peripheral transistors 446 are formed in semiconductor layer 440 and/or directly on semiconductor layer 440. Isolation regions (e.g., shallow trench isolations (STIs)) and doped regions (e.g., source regions and drain regions of peripheral transistors 446) can be formed in semiconductor layer 440 as well.

In some embodiments, each embedded DRAM cell 444 includes a DRAM selection transistor 448 and a capacitor 450. Embedded DRAM cell 444 can be a 1T1C cell consisting of one transistor and one capacitor. It is understood that embedded DRAM cell 444 may be of any suitable configuration, such as 2T1C cell, 3T1C cell, etc. In some embodiments, DRAM selection transistors 448 are formed "on" semiconductor layer 440, in which the entirety or part of DRAM selection transistors 448 are formed in semiconductor layer 440 and/or directly on semiconductor layer 440. Isolation regions (e.g., shallow trench isolations (STIs)) and doped regions (e.g., source regions and drain regions of DRAM selection transistors 448) can be formed in semiconductor layer 440 as well. As shown in FIG. 4, DRAM selection transistors 448 and peripheral transistors 446 can be formed in different regions on the same plane, e.g., on semiconductor layer 440. That is, DRAM selection transistors 448 can be formed outside of the region in which peripheral circuit 442 is formed on semiconductor layer 440. In some embodiments, capacitors 450 are disposed below DRAM selection transistors 448. Each capacitor 450 includes two electrodes, one of which is electrically connected to one node of respective DRAM selection transistor 448, according to some embodiments. Another node of each DRAM selection transistor 448 is electrical connected to a bit line 449 of embedded DRAM, according to some embodiments. Another electrode of each capacitor 450 can be electrically connected to a common plate 451, e.g., a common ground. It is understood that the structure and configuration of embedded DRAM cell 444 is not limited to the example in FIG. 4 and may include any suitable structure and configuration. For example, capacitor 450 may be a planar capacitor, a stack capacitor, a multi-fins capacitor, a cylinder capacitor, a trench capacitor, or a substrate-plate capacitor.

In some embodiments, second semiconductor structure 404 further includes semiconductor layer 440 disposed above device layer 438. Semiconductor layer 440 can be a thinned substrate on which peripheral transistors 446 and DRAM selection transistors 448 are formed. In some embodiments, semiconductor layer 440 includes single-crystal silicon. In some embodiments, semiconductor layer 440 can include polysilicon, amorphous silicon, SiGe, GaAs, Ge, or any other suitable materials. Semiconductor layer 440 can also include isolation regions and doped regions.

As shown in FIG. 4, second semiconductor structure 404 of 3D memory device 400 can further include a pad-out interconnect layer 452 above semiconductor layer 440. Pad-out interconnect layer 452 include interconnects, e.g., contact pads 454, in one or more ILD layers. In some embodiments, the interconnects in pad-out interconnect layer 452 can transfer electrical signals between 3D memory device 400 and outside circuits, e.g., for pad-out purposes. In some embodiments, second semiconductor structure 404 further includes one or more contacts 456 extending through semiconductor layer 440 to electrically connect pad-out interconnect layer 452 and interconnect layers 436 and 426. As a result, array of embedded DRAM cells 444 can be electrically connected to array of 3D NAND memory strings 416 through interconnect layers 426 and 436 as well as bonding contacts 430 and 434. Moreover, peripheral circuit 442, array of embedded DRAM cells 444, and array of 3D NAND memory strings 416 can be electrically connected to outside circuits through contacts 456 and pad-out interconnect layer 452.

Figure 5A:
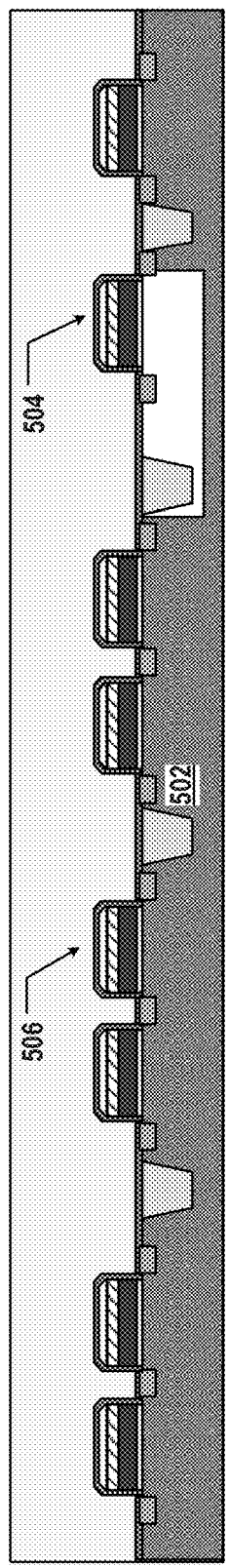
FIGS. 5A-5C illustrate a fabrication process for forming an exemplary semiconductor structure having a peripheral circuit and an embedded DRAM, according to some embodiments.
Figure 5B:
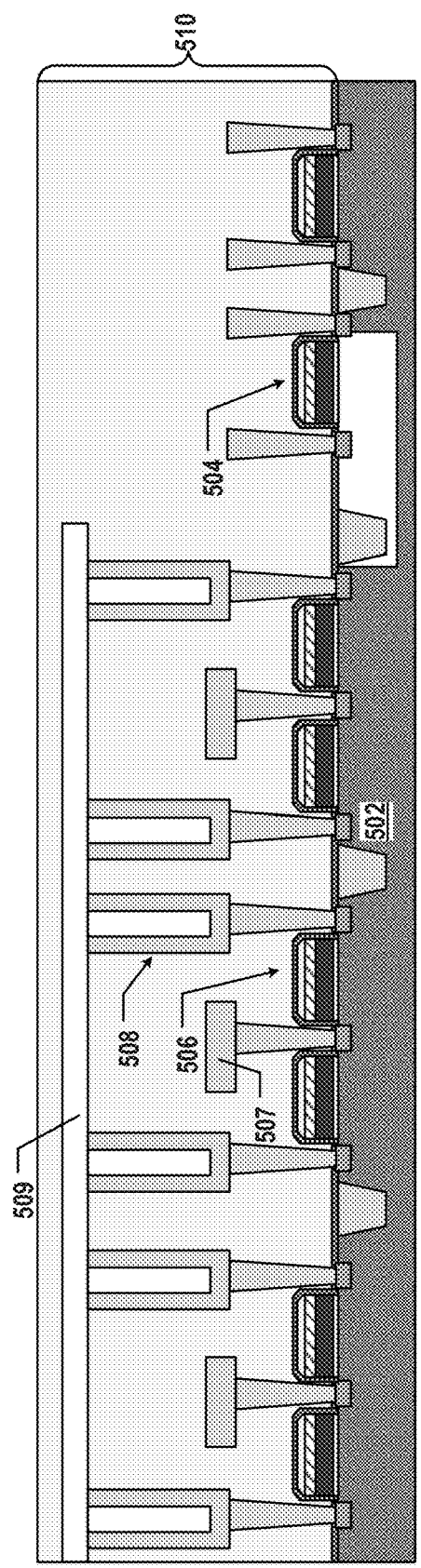
Figure 5C:
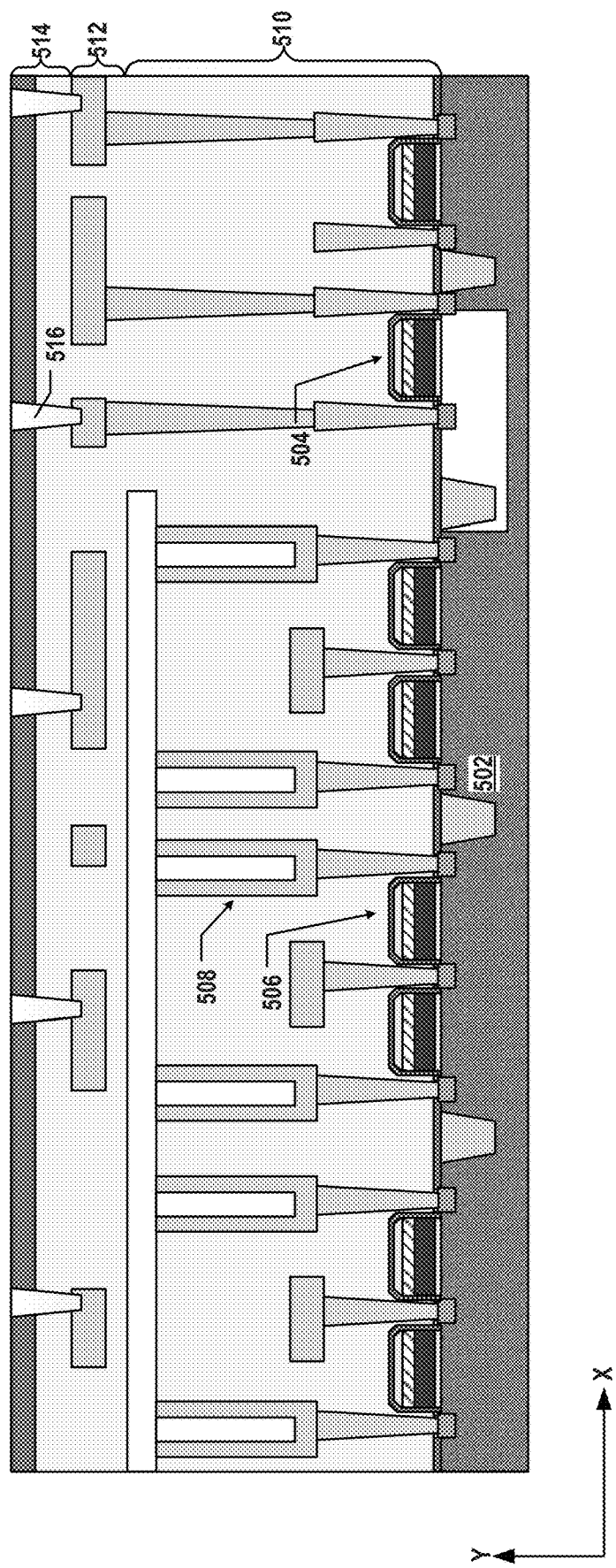
Figure 6A:
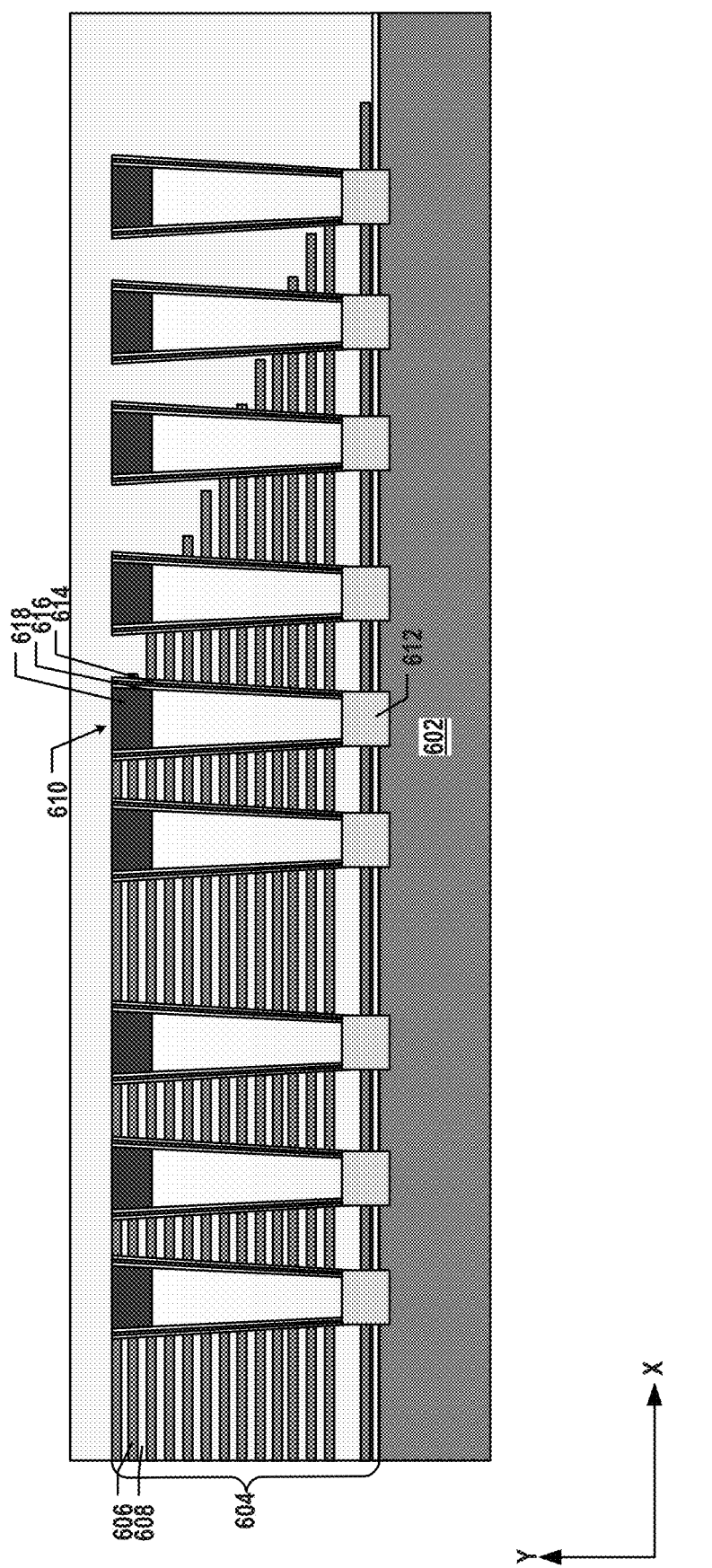
FIGS. 6A and 6B illustrate a fabrication process for forming an exemplary semiconductor structure having 3D NAND memory strings, according to some embodiments.
Figure 6B:
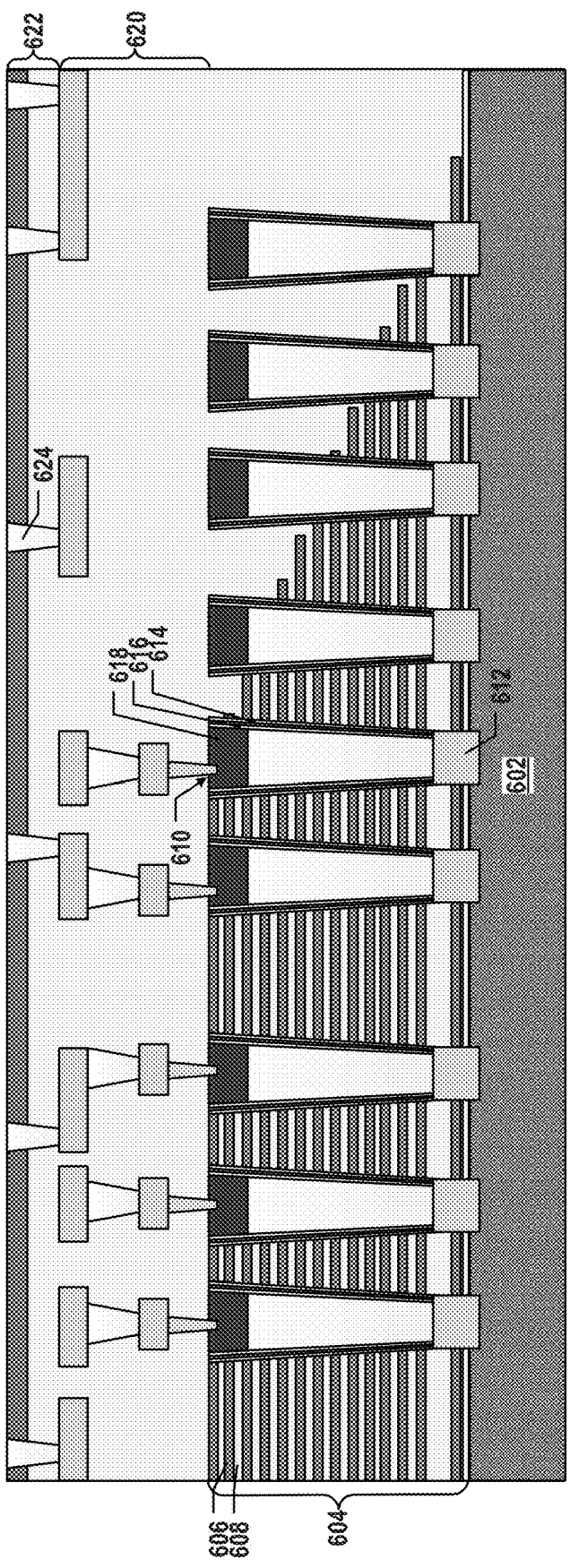
Figure 7A:
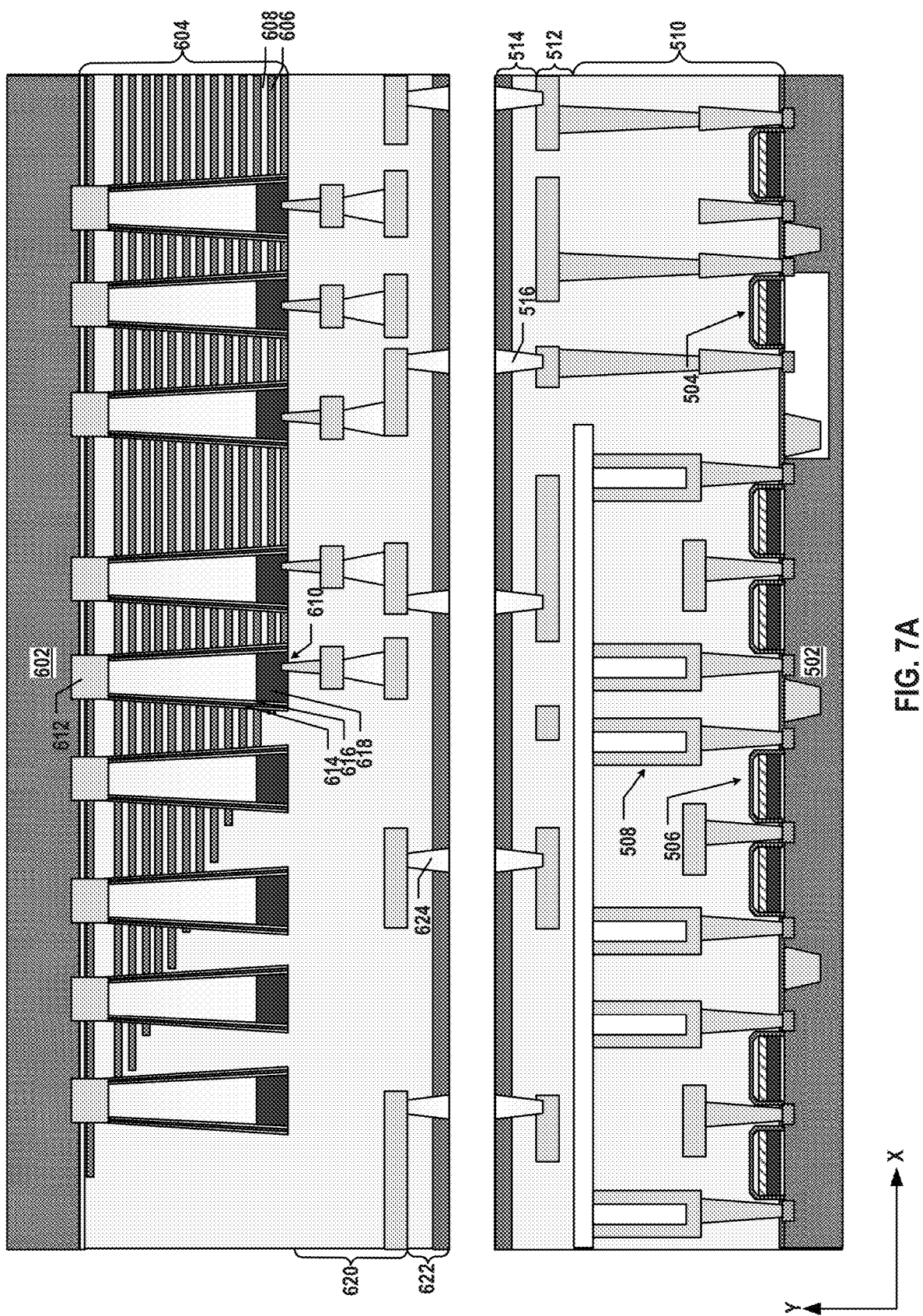
FIGS. 7A and 7B illustrate a fabrication process for forming an exemplary 3D memory device with an embedded DRAM, according to some embodiments.
Figure 7B:
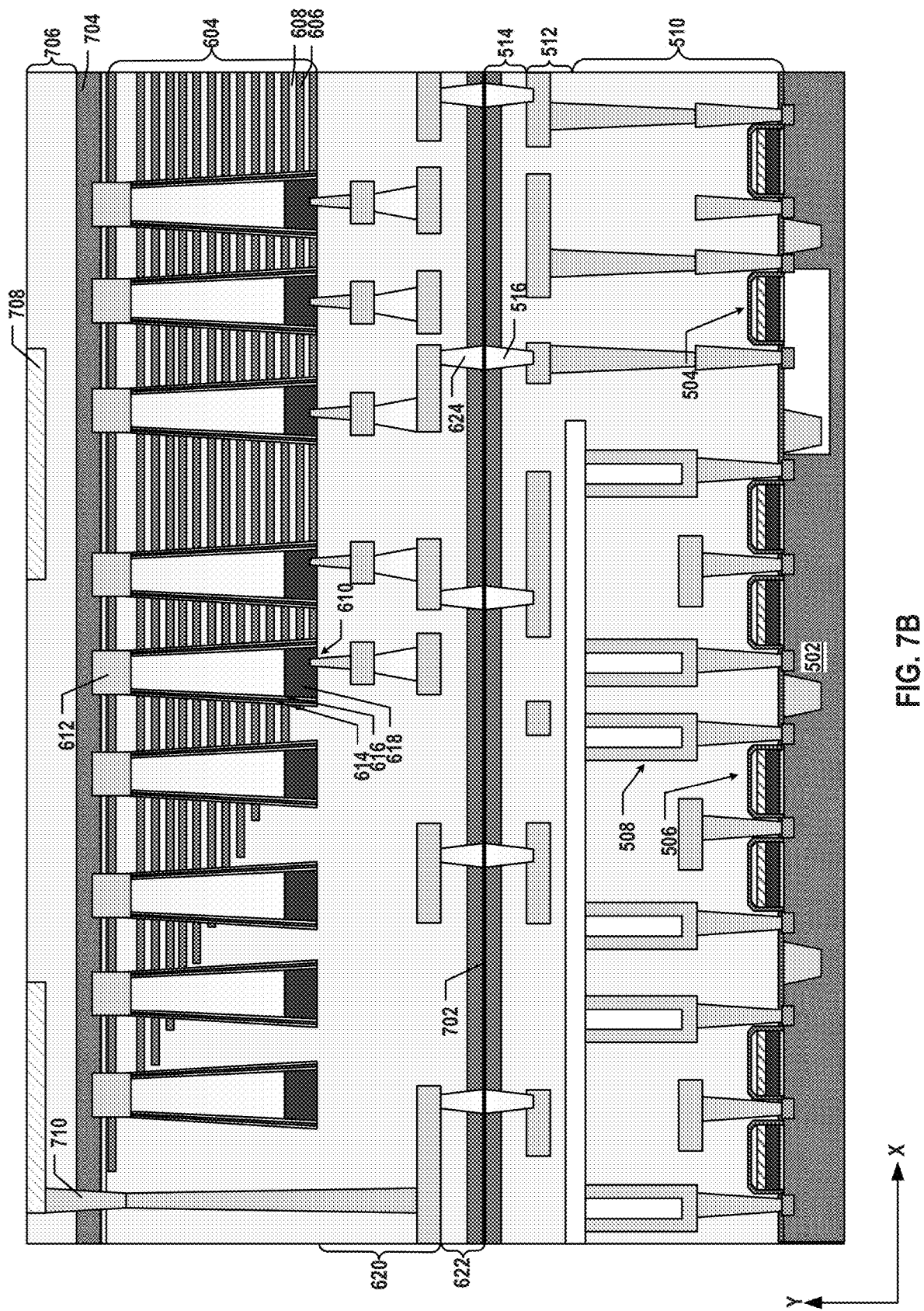
Figure 9:
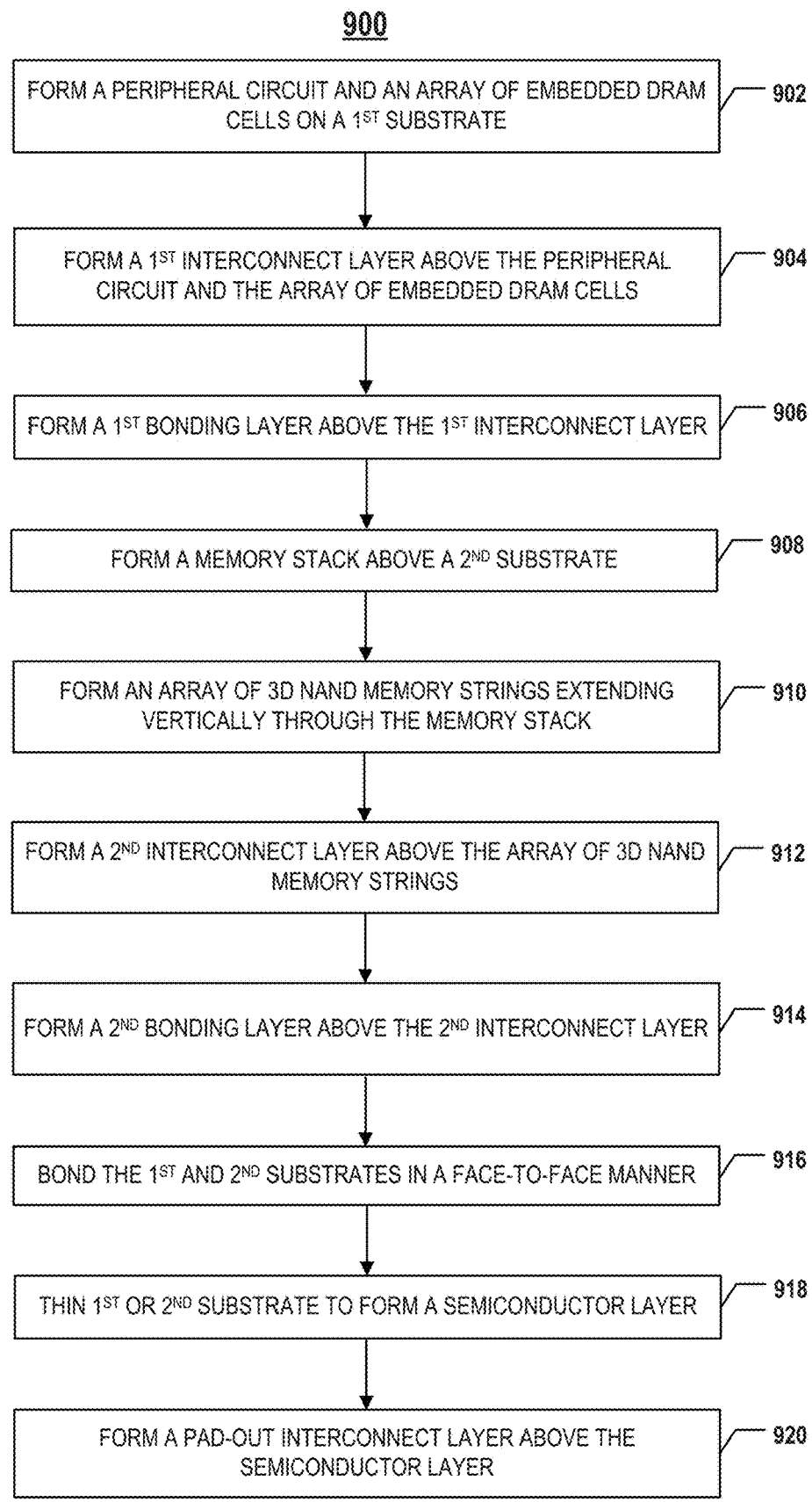
FIG. 9 is a flowchart of an exemplary method for forming a 3D memory device with an embedded DRAM, according to some embodiments.

FIGS. 5A-5C illustrate a fabrication process for forming an exemplary semiconductor structure having a peripheral circuit and an embedded DRAM, according to some embodiments. FIGS. 6A and 6B illustrate a fabrication process for forming an exemplary semiconductor structure having 3D NAND memory strings, according to some embodiments. FIGS. 7A and 7B illustrate a fabrication process for forming an exemplary 3D memory device with an embedded DRAM, according to some embodiments. FIG. 9 is a flowchart of an exemplary method 900 for forming a 3D memory device with an embedded DRAM, according to some embodiments. Examples of the 3D memory device depicted in FIGS. 5-7 and 9 include 3D memory device 300 depicted in FIG. 3 and 3D memory device 400 depicted in FIG. 4. FIGS. 5-7 and 9 will be described together. It is understood that the operations shown in method 900 are not exhaustive and that other operations can be performed as well before, after, or between any of the illustrated operations. Further, some of the operations may be performed simultaneously, or in a different order than shown in FIG. 9.

As depicted in FIGS. 5A-5C, a first semiconductor structure including a peripheral circuit, an array of embedded DRAM cells, and a first bonding layer including a plurality of first bonding contacts is formed. As depicted in FIGS. 6A and 6B, a second semiconductor structure including an array of 3D NAND memory strings and a second bonding layer including a plurality of second bonding contacts is formed. As depicted in FIGS. 7A and 7B, the first semiconductor structure and the second semiconductor structure are bonded in a face-to-face manner, such that the first bonding contacts are in contact with the second bonding contacts at a bonding interface.

Referring to FIG. 9, method 900 starts at operation 902, in which the peripheral circuit and the array of embedded DRAM cells are formed on a first substrate. The first substrate can be a silicon substrate. In some embodiments, to form the peripheral circuit and the array of embedded DRAM cells, a plurality of transistors are formed on the first substrate, and a plurality of capacitors are formed above and in contact with some of the transistors As illustrated in FIG. 5A, a plurality of transistors (e.g., peripheral transistors 504 and DRAM selection transistors 506) are formed on a silicon substrate 502. Transistors 504 and 506 can be formed by a plurality of processes including, but not limited to, photolithography, dry/wet etch, thin film deposition, thermal growth, implantation, chemical mechanical polishing (CMP), and any other suitable processes. In some embodiments, doped regions are formed in silicon substrate 502 by ion implantation and/or thermal diffusion, which function, for example, as source regions and/or drain regions of transistors 504 and 506. In some embodiments, isolation regions (e.g., STIs) are also formed in silicon substrate 502 by wet/dry etch and thin film deposition.

As illustrated in FIG. 5B, a plurality of capacitors 508 are formed above and in contact with DRAM selection transistors 506. Each capacitor 508 can be patterned by photography to be aligned with respective DRAM selection transistor 506 to form a 1T1C memory cell, for example, by electrically connecting one electrode of capacitor 508 with one node of respective DRAM selection transistor 506. In some embodiments, bit lines 507 and common plates 509 are formed as well for connecting DRAM selection transistors 506 and capacitors 508. Capacitors 508 can be formed by a plurality of processes including, but not limited to, photolithography, dry/wet etch, thin film deposition, thermal growth, implantation, CMP, and any other suitable processes. A device layer 510 including a peripheral circuit (having peripheral transistors 504) and an array of embedded DRAM cells (each having DRAM selection transistor 506 and capacitor 508) is thereby formed.

Method 900 proceeds to operation 904, as illustrated in FIG. 9, in which a first interconnect layer is formed above the peripheral circuit and the array of embedded DRAM cells. The first interconnect layer can include a first plurality of interconnects in one or more ILD layers. As illustrated in FIG. 5C, an interconnect layer 512 can be formed above device layer 510 including the peripheral circuit (having peripheral transistors 504) and the array of embedded DRAM cells (each having DRAM selection transistor 506 and capacitor 508). Interconnect layer 512 can include interconnects of MEOL and/or BEOL in a plurality of ILD layers to make electrical connections with device layer 510. In some embodiments, interconnect layer 512 includes multiple ILD layers and interconnects therein formed in multiple processes. For example, the interconnects in interconnect layers 512 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 5C can be collectively referred to as interconnect layer 512.

Method 900 proceeds to operation 906, as illustrated in FIG. 9, in which a first bonding layer is formed above the first interconnect layer. The first bonding layer can include a plurality of first bonding contacts. As illustrated in FIG. 5C, a bonding layer 514 is formed above interconnect layer 512. Bonding layer 514 can include a plurality of bonding contacts 516 surrounded by dielectrics. In some embodiments, a dielectric layer is deposited on the top surface of interconnect layer 512 by one or more thin film deposition processes including, but not limited to, CVD, PVD, ALD, or any combination thereof. Bonding contacts 516 then can be formed through the dielectric layer and in contact with the interconnects in interconnect layer 512 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 900 proceeds to operation 908, as illustrated in FIG. 9, in which a memory stack is formed above a second substrate. The second substrate can be a silicon substrate. As illustrated in FIG. 6A, interleaved sacrificial layers (not shown) and dielectric layers 608 are formed above a silicon substrate 602. The interleaved sacrificial layers and dielectric layers 608 can form a dielectric stack (not shown). In some embodiments, each sacrificial layer includes a layer of silicon nitride, and each dielectric layer 608 includes a layer of silicon oxide. The interleaved sacrificial layers and dielectric layers 608 can be formed by one or more thin film deposition processes including, but not limited to, CVD, PVD, ALD, or any combination thereof. In some embodiments, a memory stack 604 can be formed by a gate replacement process, e.g., replacing the sacrificial layers with conductor layers 606 using wet/dry etch of the sacrificial layers selective to dielectric layers 608 and filling the resulting recesses with conductor layers 606. As a result, memory stack 604 can include interleaved conductor layers 606 and dielectric layers 608. In some embodiments, each conductor layer 606 includes a metal layer, such as a layer of tungsten. It is understood that memory stack 604 may be formed by alternatingly depositing conductor layers (e.g., doped polysilicon layers) and dielectric layers (e.g., silicon oxide layers) without the gate replacement process in other embodiments. In some embodiments, a pad oxide layer including silicon oxide is formed between memory stack 604 and silicon substrate 602.

Method 900 proceeds to operation 910, as illustrated in FIG. 9, in which the array of 3D NAND memory strings extending vertically through the memory stack are formed. As illustrated in FIG. 6A, 3D NAND memory strings 610 are formed above silicon substrate 602, each of which extends vertically through interleaved conductor layers 606 and dielectric layers 608 of memory stack 604. In some embodiments, fabrication processes to form 3D NAND memory string 610 include forming a channel hole through memory stack 604 and into silicon substrate 602 using dry etching/and or wet etching, such as deep reactive-ion etching (DRIE), followed by epitaxially growing a plug 612 in the lower portion of the channel hole from silicon substrate 602. In some embodiments, fabrication processes to form 3D NAND memory string 610 also include subsequently filling the channel hole with a plurality of layers, such as a memory film 614 (e.g., a tunneling layer, a storage layer, and a blocking layer) and a semiconductor layer 616, using thin film deposition processes such as ALD, CVD, PVD, or any combination thereof. In some embodiments, fabrication processes to form 3D NAND memory string 610 further include forming another plug 618 in the upper portion of the channel hole by etching a recess at the upper end of 3D NAND memory string 610, followed by filling the recess with a semiconductor material using thin film deposition processes such as ALD, CVD, PVD, or any combination thereof.

Method 900 proceeds to operation 912, as illustrated in FIG. 9, in which a second interconnect layer is formed above the array of 3D NAND memory strings. The second interconnect layer can include a second plurality of interconnects in one or more ILD layers. As illustrated in FIG. 6B, an interconnect layer 620 can be formed above memory stack 604 and array of 3D NAND memory strings 610. Interconnect layer 620 can include interconnects of MEOL and/or BEOL in a plurality of ILD layers to make electrical connections with 3D NAND memory strings 610. In some embodiments, interconnect layer 620 includes multiple ILD layers and interconnects therein formed in multiple processes. For example, the interconnects in interconnect layers 620 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 6B can be collectively referred to as interconnect layer 620.

Method 900 proceeds to operation 914, as illustrated in FIG. 9, in which a second bonding layer is formed above the second interconnect layer. The second bonding layer can include a plurality of second bonding contacts. As illustrated in FIG. 6B, a bonding layer 622 is formed above interconnect layer 620. Bonding layer 622 can include a plurality of bonding contacts 624 surrounded by dielectrics. In some embodiments, a dielectric layer is deposited on the top surface of interconnect layer 620 by one or more thin film deposition processes including, but not limited to, CVD, PVD, ALD, or any combination thereof. Bonding contacts 624 then can be formed through the dielectric layer and in contact with the interconnects in interconnect layer 620 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 900 proceeds to operation 916, as illustrated in FIG. 9, in which the first substrate and the second substrate are bonded in a face-to-face manner, such that the first bonding contacts are in contact with the second bonding contacts at the bonding interface. The bonding can be hybrid bonding. In some embodiments, the first substrate on which the peripheral circuit and embedded DRAM cells are formed (e.g., the first semiconductor structure) is disposed above the second substrate on which the 3D NAND memory strings are formed (e.g., the second semiconductor structure) after the bonding. In some embodiments, the second substrate on which the 3D NAND memory strings are formed (e.g., the second semiconductor structure) is disposed above the first substrate on which the peripheral circuit and embedded DRAM cells are formed (e.g., the first semiconductor structure) after the bonding.

As illustrated in FIG. 7A, silicon substrate 602 and components formed thereon (e.g., 3D NAND memory strings 610) are flipped upside down. Bonding layer 622 facing down is bonded with bonding layer 514 facing up, i.e., in a face-to-face manner, thereby forming a bonding interface 702 (as shown in FIG. 7B). In some embodiments, a treatment process, e.g., a plasma treatment, a wet treatment, and/or a thermal treatment, is applied to the bonding surfaces prior to the bonding. Although not shown in FIG. 7A, silicon substrate 502 and components formed thereon (e.g., device layer 510) can be flipped upside down, and bonding layer 514 facing down can be bonded with bonding layer 622 facing up, i.e., in a face-to-face manner, thereby forming bonding interface 702. After the bonding, bonding contacts 624 in bonding layer 622 and bonding contacts 516 in bonding layer 514 are aligned and in contact with one another, such that device layer 510 (e.g., the peripheral circuit and embedded DRAM cells therein) can be electrically connected to 3D NAND memory strings 610. It is understood that in the bonded device, 3D NAND memory strings 610 may be either above or below device layer 510 (e.g., the peripheral circuit and embedded DRAM cells therein). Nevertheless, bonding interface 702 can be formed between 3D NAND memory strings 610 and device layer 510 (e.g., the peripheral circuit and embedded DRAM cells therein) after the bonding as illustrated in FIG. 7B.

Method 900 proceeds to operation 918, as illustrated in FIG. 9, in which the first substrate or the second substrate in thinned to form a semiconductor layer. In some embodiments, the first substrate of the first semiconductor structure, which is above the second substrate of the second semiconductor structure after the bonding, is thinned to form the semiconductor layer. In some embodiments, the second substrate of the second semiconductor structure, which is above the first substrate of the first semiconductor structure after the bonding, is thinned to form the semiconductor layer.

As illustrated in FIG. 7B, the substrate on top of the bonded 3D memory device (e.g., silicon substrate 402 as shown in FIG. 7A) is thinned, so that the thinned top substrate can serve as a semiconductor layer 704, for example, a single-crystal silicon layer. The thickness of the thinned substrate can be between about 200 nm and about 5 μm, such as between 200 nm and 5 μm, or between about 150 nm and about 50 μm, such as between 150 nm and 50 μm. Silicon substrate 402 can be thinned by processes including, but not limited to, wafer grinding, dry etch, wet etch, CMP, any other suitable processes, or any combination thereof. It is understood that when silicon substrate 502 is the substrate on top of the bonded 3D memory device, another semiconductor layer may be formed by thinning silicon substrate 502.

Method 900 proceeds to operation 920, as illustrated in FIG. 9, in which a pad-out interconnect layer is formed above the semiconductor layer. As illustrated in FIG. 7B, a pad-out interconnect layer 706 is formed above semiconductor layer 704 (the thinned top substrate). Pad-out interconnect layer 705 can include interconnects, such as pad contacts 708, formed in one or more ILD layers. Pad contacts 708 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 710 are formed extending vertically through semiconductor layer 704, for example by wet/dry etch followed by depositing conductive materials. Contacts 710 can be in contact with the interconnects in pad-out interconnect layer 706.

Figure 8:
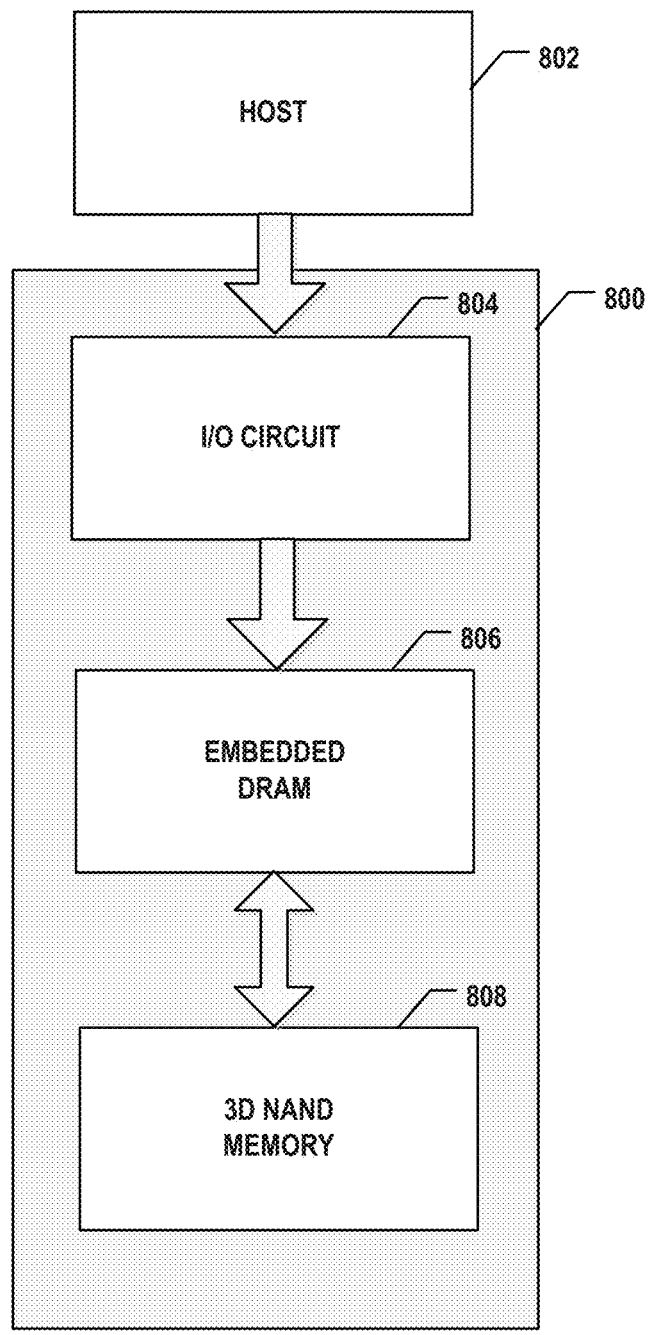
FIG. 8 illustrates an exemplary operation of a 3D memory device with an embedded DRAM, according to some embodiments.
Figure 10:
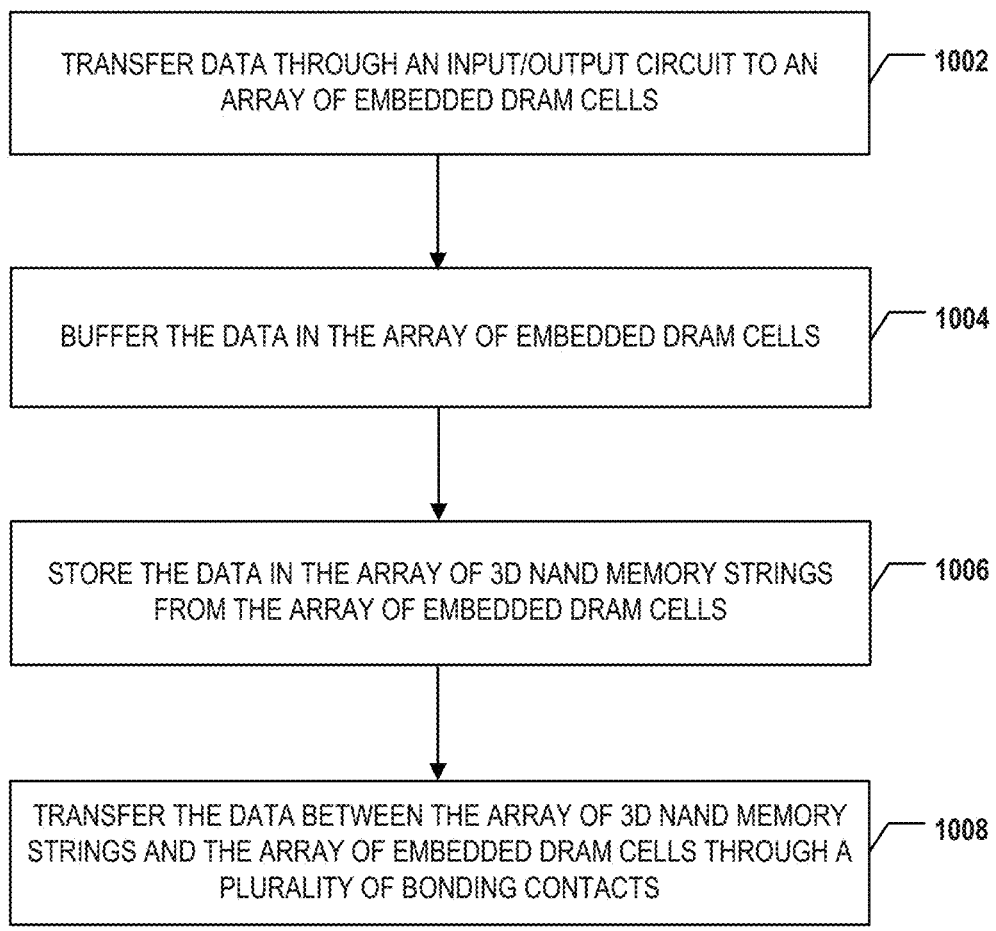
FIG. 10 is a flowchart of an exemplary method for operating a 3D memory device with an embedded DRAM, according to some embodiments.

FIG. 8 illustrates an exemplary operation of a 3D memory device 800 with embedded DRAM 806, according to some embodiments. FIG. 10 is a flowchart of an exemplary method 1000 for operating a 3D memory device with an embedded DRAM, according to some embodiments. Examples of the 3D memory device 800 depicted in FIG. 8 include 3D memory device 300 depicted in FIG. 3 and 3D memory device 400 depicted in FIG. 4. FIGS. 8 and 10 will be described together. It is understood that the operations shown in method 1000 are not exhaustive and that other operations can be performed as well before, after, or between any of the illustrated operations. Further, some of the operations may be performed simultaneously, or in a different order than shown in FIG. 10. As illustrated in FIG. 8, 3D memory device 800 includes an input/output circuit 804 (e.g., part of its peripheral circuits), embedded DRAM 806 having an array of embedded DRAM cells, and 3D NAND memory 808 having an array of 3D NAND memory strings. Input/output circuit 804, embedded DRAM 806, and 3D NAND memory 808 can be formed in the same chip as describe above in detail.

Referring to FIG. 10, method 1000 starts at operation 1002, in which data is transferred through the input/output circuit to the array of embedded DRAM cells. As illustrated in FIG. 8, any suitable type of data generated by a host 802 is transferred to embedded DRAM 806 of 3D memory device 800 through input/output circuit 804. Host 802 can be any suitable devices that generate the data, such as one or more processors. In some embodiments, host 802 includes a central processing unit (CPU), a graphics processor (e.g., graphics processing unit (GPU)), an application processor (AP), a general processor (e.g., APU, accelerated processing unit; GPGPU, general-purpose computing on GPU), or any other suitable processor. Input/output circuit 804 can be a high-speed, high-throughput input/output circuit as part of the peripheral circuits. Host 802 and 3D memory device 800 can be part of any suitable apparatus, for example, a virtual reality (VR)/augmented reality (AR) device (e.g., VR headset, etc.), handheld device (e.g., dumb or smart phone, tablet, etc.), wearable device (e.g., eyeglasses, wrist watch, etc.), automobile control station, gaming console, television set, laptop computer, desktop computer, netbook computer, media center, set-top box, global positioning system (GPS), printer, or any other suitable device.

Method 1000 proceeds to operation 1004, as illustrated in FIG. 10, in which the data is buffered in the array of embedded DRAM cells. As illustrated in FIG. 8, embedded DRAM 806 can work as an integrated high-speed, on-chip buffer of 3D memory device 800 for buffering the data transferred from host 802 through input/output circuit 804.

Method 1000 proceeds to operation 1006, as illustrated in FIG. 10, in which the data is stored in the array of 3D NAND memory strings from the array of embedded DRAM cells. As illustrated in FIG. 8, 3D NAND memory 808, the data buffered in embedded DRAM 806 can be stored in 3D NAND memory 808. In some embodiments, the data is buffered in embedded DRAM 806 and stored in 3D NAND memory 808 in parallel.

Method 1000 proceeds to operation 1008, as illustrated in FIG. 10, in which the data is transferred between the array of 3D NAND memory strings and the array of embedded DRAM cells through a plurality of bonding contacts. In some embodiments, the transferring is triggered in response to power on or power off of the 3D memory device. As illustrated in FIG. 8, data can be transferred between embedded DRAM 806 and 3D NAND memory 808 through direct electrical connections by a plurality of bonding contacts as described above in detail, which have shortened distance, higher throughput, and lower power consumption compared with the conventional on-board chip-to-chip data bus. An instant-on feature of host 802 can be enabled by the data transferred between embedded DRAM 806 and 3D NAND memory 808. In some embodiments, in response to power off of host 802 and/or 3D memory device 800, a snapshot of user data and/or operation system data buffered in embedded DRAM 806 is immediately transferred to 3D NAND memory 808, which can be retained after power off. In response to power on of host 802 and/or 3D memory device 800, the snapshot of user data and/or operation system data stored in 3D NAND memory 808 can be immediately transferred back to embedded DRAM 806 to restore the last state of host 802 prior to the power-off.

According to one aspect of the present disclosure, a 3D memory device includes a first semiconductor structure including a peripheral circuit, an array of embedded DRAM cells, and a first bonding layer including a plurality of first bonding contacts. The 3D memory device also further includes a second semiconductor structure including an array of 3D NAND memory strings and a second bonding layer including a plurality of second bonding contacts. The 3D memory device further includes a bonding interface between the first bonding layer and the second bonding layer. The first bonding contacts are in contact with the second bonding contacts at the bonding interface.

In some embodiments, the first semiconductor structure includes a substrate, the peripheral circuit on the substrate, the array of embedded DRAM cells on the substrate and outside of the peripheral circuit, and the first bonding layer above the peripheral circuit and the array of embedded DRAM cells.

In some embodiments, the second semiconductor structure includes the second bonding layer above the first bonding layer, a memory stack above the second bonding layer, the array of 3D NAND memory strings extending vertically through the memory stack, and a semiconductor layer above and in contact with the array of 3D NAND memory strings. In some embodiments, the 3D memory device further includes a pad-out interconnect layer above the semiconductor layer.

In some embodiments, the semiconductor layer includes polysilicon. In some embodiments, the semiconductor layer includes single-crystal silicon.

In some embodiments, the second semiconductor structure includes a substrate, a memory stack above the substrate, the array of 3D NAND memory strings extending vertically through the memory stack, and the second bonding layer above the memory stack and the array of 3D NAND memory strings.

In some embodiments, the first semiconductor structure includes the first bonding layer above the second bonding layer, the peripheral circuit above the first bonding layer, the array of embedded DRAM cells above the first bonding layer and outside of the peripheral circuit, and a semiconductor layer above and in contact with the peripheral circuit and the array of embedded DRAM cells. In some embodiments, the 3D memory device further includes a pad-out interconnect layer above the semiconductor layer.

In some embodiments, the peripheral circuit and the array of embedded DRAM cells are stacked one over another.

In some embodiments, each embedded DRAM cell includes a transistor and a capacitor.

In some embodiments, the first semiconductor structure includes a first interconnect layer vertically between the first bonding layer and the array of embedded DRAM cells, and the second semiconductor structure includes a second interconnect layer vertically between the second bonding layer and the array of 3D NAND memory strings.

In some embodiments, the array of embedded DRAM cells are electrically connected to the array of 3D NAND memory strings through the first and second interconnect layers and the first and second bonding contacts.

According to another aspect of the present disclosure, a method for forming a 3D memory device is disclosed. A first semiconductor structure is formed. The first semiconductor structure includes a peripheral circuit, an array of embedded DRAM cells, and a first bonding layer including a plurality of first bonding contacts. A second semiconductor structure is formed. The second semiconductor structure includes an array of 3D NAND memory strings and a second bonding layer including a plurality of second bonding contacts. The first semiconductor structure and the second semiconductor structure are bonded in a face-to-face manner, such that the first bonding contacts are in contact with the second bonding contacts at a bonding interface.

In some embodiments, to form the first semiconductor structure, the peripheral circuit and the array of embedded DRAM cells are formed on a first substrate, a first interconnect layer is formed above the peripheral circuit and the array of embedded DRAM cells, and the first bonding layer is formed above the first interconnect layer.

In some embodiments, to form the peripheral circuit and the array of embedded DRAM cells, a plurality of transistors are formed on the first substrate, and a plurality of capacitors are formed above and in contact with some of the transistors.

In some embodiments, to form the second semiconductor structure, a memory stack is formed above a second substrate, the array of 3D NAND memory strings extending vertically through the memory stack are formed, a second interconnect layer is formed above the array of 3D NAND memory strings, and the second bonding layer is formed above the second interconnect layer.

In some embodiments, the second semiconductor structure is above the first semiconductor structure after the bonding. In some embodiments, the second substrate is thinned to form a semiconductor layer after the bonding, and a pad-out interconnect layer is formed above the semiconductor layer.

In some embodiments, the first semiconductor structure is above the second semiconductor structure after the bonding. In some embodiments, the first substrate is thinned to form a semiconductor layer after the bonding, and a pad-out interconnect layer is formed above the semiconductor layer.

In some embodiments, the bonding includes hybrid bonding.

According to still another aspect of the present disclosure, a method for operating a 3D memory device is disclosed. The 3D memory device includes an input/output circuit, an array of embedded DRAM cells, and an array of 3D NAND memory strings in a same chip. Data is transferred through the input/output circuit to the array of embedded DRAM cells. The data is buffered in the array of embedded DRAM cells. The data is stored in the array of 3D NAND memory strings from the array of embedded DRAM cells.

In some embodiments, the data is transferred between the array of 3D NAND memory strings and the array of embedded DRAM cells through a plurality of bonding contacts.

In some embodiments, the transferring is triggered in response to power on or power off of the 3D memory device.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
    a first semiconductor structure comprising a peripheral circuit, a first bonding layer comprising at least one first bonding contact electronically connected to the peripheral circuit, and a first interconnect layer vertically between the first bonding layer and the peripheral circuit;
    a second semiconductor structure comprising an array of 3D NAND memory strings, a second bonding layer comprising at least one second bonding contact electronically connected to the array of 3D NAND memory strings, and a second interconnect layer vertically between the second bonding layer and the array of 3D NAND memory strings; and
    a bonding interface between the first semiconductor structure and the second semiconductor structure.

2. The 3D memory device of claim 1, wherein the first semiconductor structure comprises:
    a substrate;
    the peripheral circuit on the substrate; and
    the first bonding layer above the peripheral circuit.

3. The 3D memory device of claim 2, wherein the second semiconductor structure comprises:
    the second bonding layer above the first bonding layer;
    a memory stack above the second bonding layer;
    the array of 3D NAND memory strings extending vertically through the memory stack; and
    a semiconductor layer above and in contact with the array of 3D NAND memory strings.

4. The 3D memory device of claim 3, further comprising a pad-out interconnect layer above the semiconductor layer.

5. The 3D memory device of claim 3, wherein the semiconductor layer comprises polysilicon.

6. The 3D memory device of claim 3, wherein the semiconductor layer comprises single-crystal silicon.

7. The 3D memory device of claim 1, wherein the second semiconductor structure comprises:
    a substrate;
    a memory stack above the substrate;
    the array of 3D NAND memory strings extending vertically through the memory stack; and
    the second bonding layer above the memory stack and the array of 3D NAND memory strings.

8. The 3D memory device of claim 7, wherein the first semiconductor structure comprises:
    the first bonding layer above the second bonding layer;
    the peripheral circuit above the first bonding layer; and
    a semiconductor layer above and in contact with the peripheral circuit.

9. The 3D memory device of claim 8, further comprising a pad-out interconnect layer above the semiconductor layer.

10. The 3D memory device of claim 1, wherein the peripheral circuit is electrically connected to the array of 3D NAND memory strings through the first and second interconnect layers and the at least one first bonding contact and the at least one second bonding contact.

11. The 3D memory device of claim 1, wherein each of the first interconnect layer and the second interconnect layer comprises at least one lateral interconnect line and at least one vertical interconnect access contact.

12. The 3D memory device of claim 11, wherein each of the first interconnect layer and the second interconnect layer comprises one or more interlayer dielectric layers in which the at least one lateral interconnect line and the at least one vertical interconnect access contact are formed.

13. The 3D memory device of claim 1, wherein:
    the peripheral circuit comprises peripheral transistors; and
    the first semiconductor structure comprises dynamic random-access memory (DRAM) selection transistors in a same device layer with the peripheral transistors.

14. A method for forming a three-dimensional (3D) memory device, comprising:
    forming a first semiconductor structure comprising a peripheral circuit, a first bonding layer comprising at least one first bonding contact electronically connected to the peripheral circuit, and a first interconnect layer vertically between the first bonding layer and the peripheral circuit;
    forming a second semiconductor structure comprising an array of 3D NAND memory strings, a second bonding layer comprising at least one second bonding contact electronically connected to the array of 3D NAND memory strings, and a second interconnect layer vertically between the second bonding layer and the array of 3D NAND memory strings; and
    bonding the first semiconductor structure and the second semiconductor structure in a face-to-face manner, such that the first semiconductor structure and the second semiconductor structure are in contact at a bonding interface.

15. The method of claim 14, wherein forming the first semiconductor structure comprises:
    forming the peripheral circuit on a first substrate;

forming the first interconnect layer above the peripheral circuit; and forming the first bonding layer above the first interconnect layer.

16. The method of claim 14, wherein forming the second semiconductor structure comprises:

forming a memory stack above a second substrate;

forming the array of 3D NAND memory strings extending vertically through the memory stack;

forming the second interconnect layer above the array of 3D NAND memory strings; and forming the second bonding layer above the second interconnect layer.

17. The method of claim 16, further comprising:

thinning the second substrate to form a semiconductor layer after the bonding; and forming a pad-out interconnect layer above the semiconductor layer.

18. The method of claim 17, wherein the first semiconductor structure is above the second semiconductor structure after the bonding.

19. The method of claim 14, wherein forming the second interconnect layer comprises:

forming at least one lateral interconnect line and at least one vertical interconnect access contact in one or more interlayer dielectric layers to make electrical connections with the array of 3D NAND memory strings.

20. The method of claim 14, wherein the second semiconductor structure is above the first semiconductor structure after the bonding.

\* \* \* \* \*